United States Patent
Morishima

[11] Patent Number: 5,969,995
[45] Date of Patent: Oct. 19, 1999

[54] STATIC SEMICONDUCTOR MEMORY DEVICE HAVING ACTIVE MODE AND SLEEP MODE

[75] Inventor: Chikayoshi Morishima, Hyogo, Japan

[73] Assignee: Mitsubishi Denki Kabushiki Kaisha, Tokyo, Japan

[21] Appl. No.: 09/129,095

[22] Filed: Aug. 5, 1998

[30] Foreign Application Priority Data

Feb. 3, 1998 [JP] Japan .................................. 10-021967

[51] Int. Cl.⁶ .................................................. G11C 16/04
[52] U.S. Cl. ............... 365/189.01; 365/229; 365/189.04; 365/230.06
[58] Field of Search .................... 365/189.01, 230.06, 365/189.04, 185.24, 226, 229; 327/157

[56] References Cited

U.S. PATENT DOCUMENTS

5,262,998  11/1993  Mnich et al. ........................... 365/222
5,615,162  3/1997  Houston ................................. 365/226
5,783,956  7/1998  Ooishi ................................... 327/157

*Primary Examiner*—David Nelms
*Assistant Examiner*—Thong Le
*Attorney, Agent, or Firm*—McDermott, Will & Emery

[57] ABSTRACT

A power supply control circuit of an SRAM cuts off supply of power supply voltage to any component other than memory cells and a word line potential fix circuit in a sleep period in which only retention of data is carried out. The word line potential fix circuit fixes a word line at a non-selection level in the sleep period. The potential on the word line never becomes unstable in the sleep period so that data in the memory cell is never destroyed. Accordingly, a static semiconductor memory device consuming less power and having a high data retention ability can be provided.

8 Claims, 5 Drawing Sheets

STATIC SEMICONDUCTOR MEMORY DEVICE HAVING ACTIVE MODE AND SLEEP MODE

BACKGROUND OF THE INVENTION

1. Field of the Invention

The present invention relates to a static semiconductor memory device, and particularly to a static semiconductor memory device having an active mode for reading/writing data as well as a sleep mode for only holding data.

2. Description of the Background Art

Figure 7:
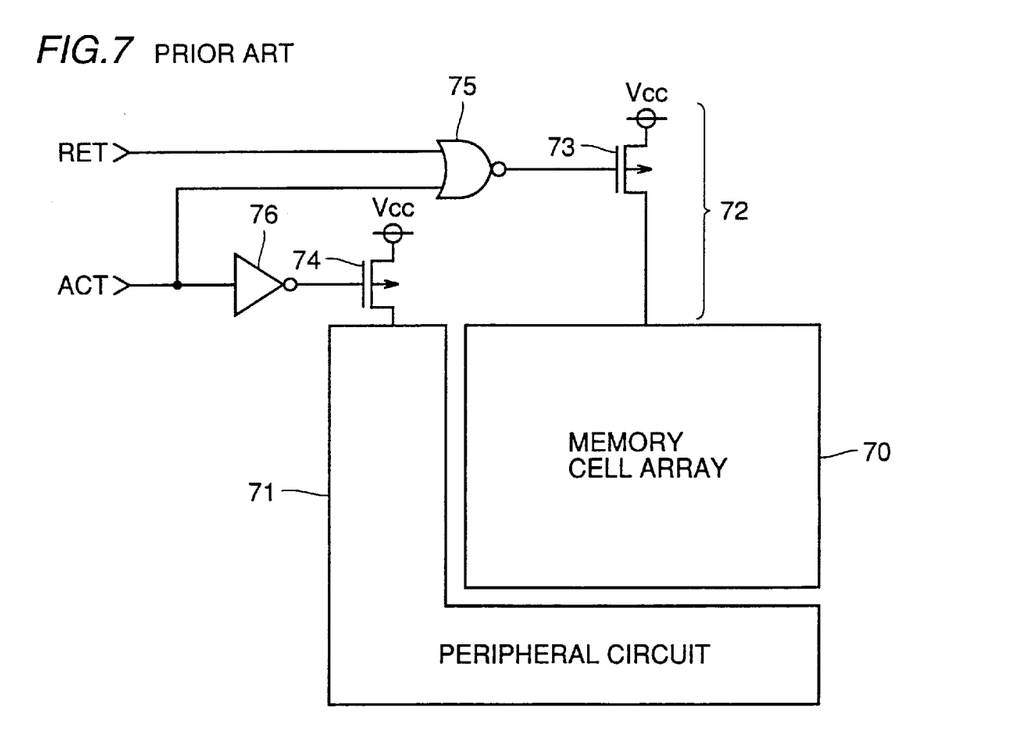
FIG. 7 is a circuit block diagram showing a structure of a conventional SRAM.

FIG. 7 is a circuit block diagram showing a structure of a static random access memory (hereinafter referred to as SRAM) disclosed by U.S. Pat. No. 5,615,162. Referring to FIG. 7, the SRAM includes a memory cell array 70, a peripheral circuit 71 and a power supply control circuit 72.

Memory cell array 70 includes a plurality of memory cells arranged in rows and columns. Each memory cell stores data of 1 bit. Peripheral circuit 71 reads/writes data from/into memory cell array 70. Power supply control circuit 72 is controlled by retain signal RET and active signal ACT, and supplies power supply voltage Vcc to memory cell array 70 and peripheral circuit 71.

Power supply control circuit 72 includes P channel MOS transistors 73 and 74, an NOR gate 75, and an inverter 76. Power supply voltage Vcc is supplied to memory cell array 70 via P channel MOS transistor 73, and to peripheral circuit 71 via P channel MOS transistor 74. NOR gate 75 receives retain signal RET and active signal ACT, and an output from NOR gate 75 is input to the gate of P channel MOS transistor 73. Inverter 76 receives active signal ACT, and an output from inverter 76 is input to the gate of P channel MOS transistor 74.

An operation of the SRAM shown in FIG. 7 is next described. During an active period, active signal ACT is at "H" level which is an activation level, P channel MOS transistors 73 and 74 are conductive, and supply voltage Vcc is supplied to both of memory cell array 70 and peripheral circuit 71. Reading and writing of data is thus possible.

During a sleep period, retain signal RET is at "H" level of the activation level, and active signal ACT is at "L" level of an inactivation level. Accordingly, P channel MOS transistor 73 is conductive and power supply voltage Vcc is supplied to memory cell array 70 so that retention of data is possible. Although P channel MOS transistor 74 is not conductive and supply voltage Vcc is not supplied to peripheral circuit 71 to make reading/writing of data impossible, consumption power can be reduced.

In the SRAM shown in FIG. 7, during the sleep period, supply of power supply voltage Vcc to a row decoder in peripheral circuit 71 is also stopped and the potential on a word line included in memory cell array 70 becomes unstable. As a result, an access transistor of the memory cell could be rendered conductive and data in the memory cell could be rewritten.

SUMMARY OF THE INVENTION

An object of the present invention is to provide a static semiconductor memory device consuming less power and having a high data retention ability.

A static semiconductor memory device according to the present invention is briefly described as the one including a switch connected between each word line and a line of a reference potential and rendered conductive in the sleep mode to fix each word line in a non-selected state. Therefore, the potential on a word line never becomes unstable in the sleep mode as in the conventional SRAM, so that rewriting of data in a memory cell never occurs. Accordingly, a static semiconductor memory device consuming less power and having a high data retention ability can be obtained.

Preferably, a read/write circuit of the static semiconductor memory device includes a signal generation circuit for selecting any of a plurality of word lines and outputting a word line selection signal to set the word line in a selected state according to an address signal, and includes a gate circuit passing a word line selection signal to a corresponding word line in the active mode and inhibiting the word line selection signal from passing in the sleep mode. In this case, even if an address signal is input during the sleep period, no word line is set in a selected state.

Still preferably, the switch of the static semiconductor memory device includes a transistor having a threshold voltage higher than that of a transistor included in the read/write circuit. In this case, consumption power can be further reduced without decreasing reading/writing speed.

Still preferably, the read/write circuit of the static semiconductor memory device includes a plurality of transistors formed on a semiconductor substrate. Power supply voltage is applied to the semiconductor substrate during both periods of the active mode and the sleep mode. In this case, off-leakage current flowing through the read/write circuit is relatively small due to body effect of the transistors.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
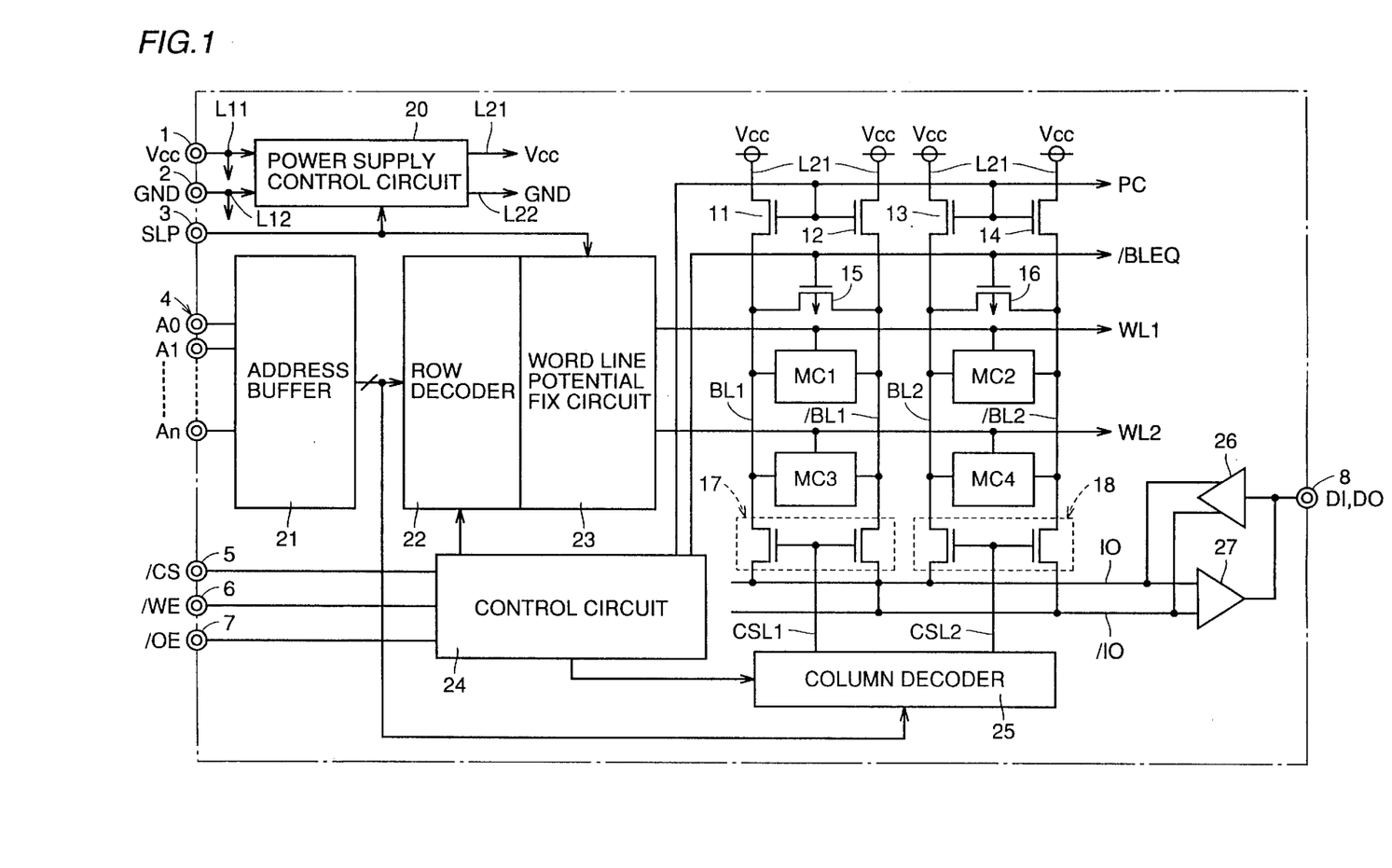
FIG. 1 is a circuit block diagram showing an entire structure of an SRAM according to one embodiment of the invention.

FIG. 1 is a block diagram showing an entire structure of an SRAM according to one embodiment of the invention.

Referring to FIG. 1, the SRAM is provided with a power supply terminal 1, a ground terminal 2, a sleep signal input terminal 3, a group of address signal input terminals 4, control signal input terminals 5–7, and a data input/output terminal 8. Power supply potential Vcc is externally supplied to power supply terminal 1. Ground potential GND is externally supplied to ground terminal 2.

The supply potential Vcc provided to supply terminal 1 is supplied directly to a line L11 of supply potential Vcc and selectively to a line L21 of supply potential Vcc. The ground potential GND provided to ground terminal 2 is supplied directly to a line L12 of ground potential GND and selectively to a line L22 of ground potential GND. Details of this operation is given later.

Sleep signal SLP is externally supplied to sleep signal input terminal 3. Address signals A0–An (n is an integer of 0 or more) are supplied externally to group of address signal input terminals 4. Chip select signal /CS, write enable signal /WE and output enable signal /OE are externally supplied to control signal input terminals 5–7 respectively. Data input/output terminal 8 is used for input of write data DI and output of read data DO.

The SRAM further includes a plurality of (4 for simplifying description) memory cells MC1–MC4 arranged in rows and columns, word lines WL1 and WL2 provided correspondingly to each row, and pairs of bit lines BL1, /BL1; BL2, /BL2 provided correspondingly to each column.

Figure 2:
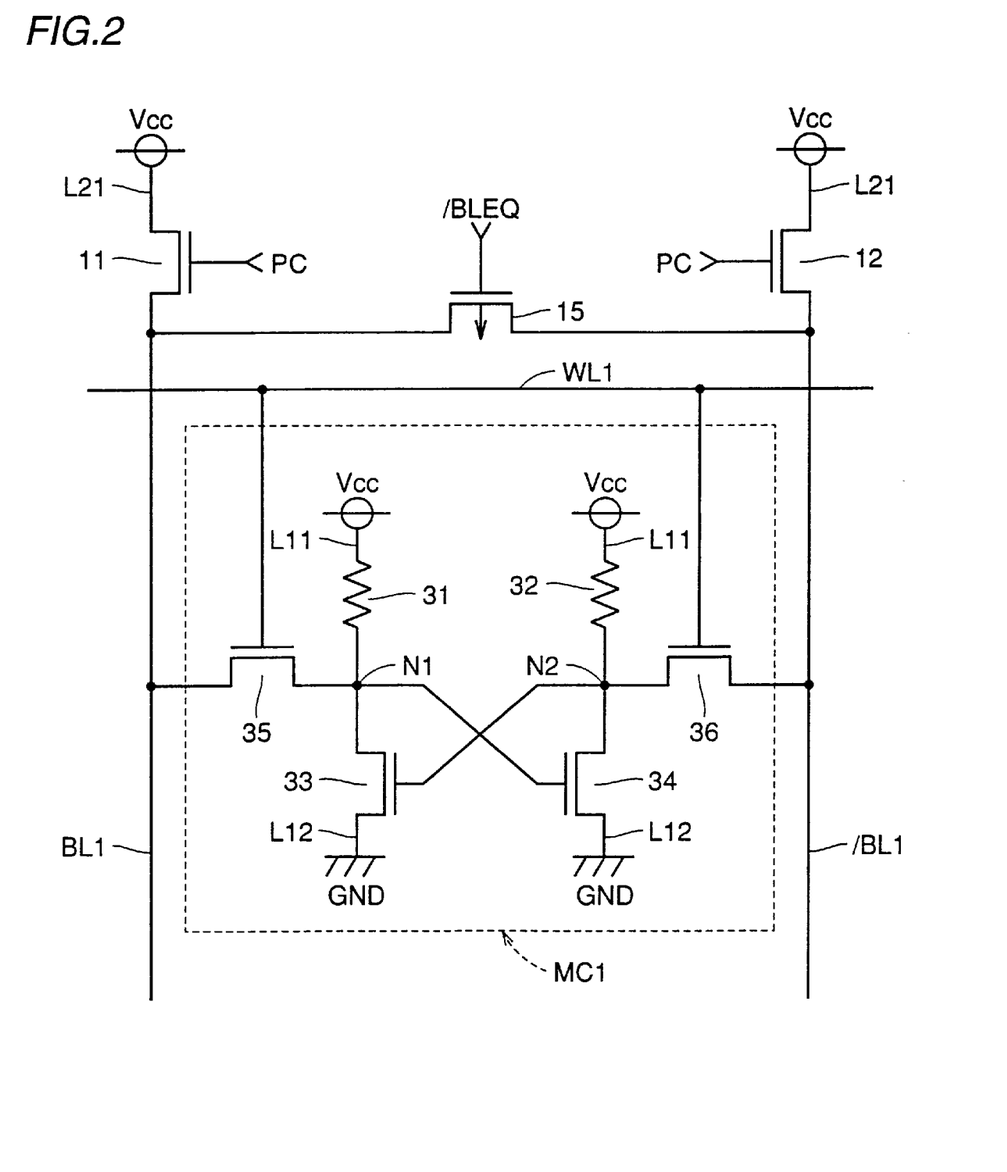
FIG. 2 is a circuit diagram showing a structure of a memory cell shown in FIG. 1.

Memory cell MC1 includes, as shown in FIG. 2, load resistance elements 31 and 32, driver transistors (N channel MOS transistors) 33 and 34, access transistors (N channel MOS transistors) 35 and 36, and storage nodes N1 and N2. Load resistance elements 31 and 32 are respectively connected between lines L11 of supply potential Vcc and storage nodes N1 and N2. Driver transistors 33 and 34 are respectively connected between storage nodes N1 and N2 and lines L12 of ground potential GND, and have their gates respectively connected to storage nodes N2 and N1. Access transistors 35 and 36 are respectively connected between storage nodes N1 and N2 and bit lines BL1 and /BL1, and have their gates both connected to word line WL1.

Memory cell MC1 is activated by setting word line WL1 to "H" level of a selection level to render access transistors 35 and 36 conductive. Memory cell MC1 is inactivated by setting word line WL1 to "L" level of a non-selection level to render access transistors 35 and 36 non-conductive.

In writing operation, memory cell MC1 is activated, one of bit lines BL1 and /BL1 is set to "H" level and the other is set to "L" level according to write data DI. Consequently, one of driver transistors 33 and 34 is rendered conductive and the other is rendered non-conductive, and levels of bit lines BL1 and /BL1 are latched by storage nodes N1 and N2. After memory cell MC1 is inactivated, current is supplied from lines L11 of Vcc to storage nodes N1 and N2 via load resistance elements 31 and 32, and the level of storage nodes N1 and N2 or write data DI is retained.

In reading operation, memory cell MC1 is activated, and via one of driver transistors 33 and 34 which is conductive, current flows from one of bit lines BL1 and /BL1 corresponding to the conductive driver transistor to line L12 of ground potential GND, and the corresponding bit line is set to "L" level. In this state, levels of bit lines BL1 and /BL1 are compared with each other to read data of memory cell MC1.

Further, the SRAM includes bit line loads 11–14 for charging bit lines BL1–/BL2 to a prescribed potential, equalizers 15 and 16 for equalizing the potential between bit lines BL1 and /BL1, and BL2 and /BL2 in the reading operation, a pair of data input/output lines IO and /IO, and column selection gates 17 and 18 for connecting bit line pairs BL1, /BL1 and BL2, /BL2 with data input/output line pair IO and /IO.

Bit line loads 11–14 are each connected between line L21 of supply potential Vcc and one end of each of bit lines BL1–/BL2, and formed of an N channel MOS transistor having its gate receiving precharge signal PC. Equalizers 15 and 16 are respectively connected between bit lines BL1 and /BL1, and BL2 and /BL2, and each of the equalizers is formed of a P channel MOS transistor having its gate receiving bit line equalize signal /BLEQ.

Column selection gate 17 is provided with an N channel MOS transistor connected between the other end of bit line BL1 and one end of data input/output line IO, and an N channel MOS transistor connected between the other end of bit line /BL1 and one end of data input/output line /IO, and the gates of the two N channel MOS transistors are connected to one end of a column selection line CSL1. Column selection gate 18 is provided with an N channel MOS transistor connected between the other end of bit line BL2 and one end of data input/output line IO, and an N channel MOS transistor connected between the other end of bit line /BL2 and one end of data input/output line /IO, and the gates of the two N channel MOS transistors are connected to one end of a column selection line CSL2.

The SRAM is further provided with a power supply control circuit 20, an address buffer 21, a row decoder 22, a word line potential fix circuit 23, a control circuit 24, a column decoder 25, a write circuit 26 and a read circuit 27.

Power supply control circuit 20 receives supply potential Vcc and ground potential GND via line L11 of supply potential Vcc and line L12 of ground potential GND. Power supply control circuit 20 supplies supply potential Vcc and ground potential GND selectively to line L21 of supply potential Vcc and line L22 of ground potential GND according to sleep signal SLP.

Figure 3:
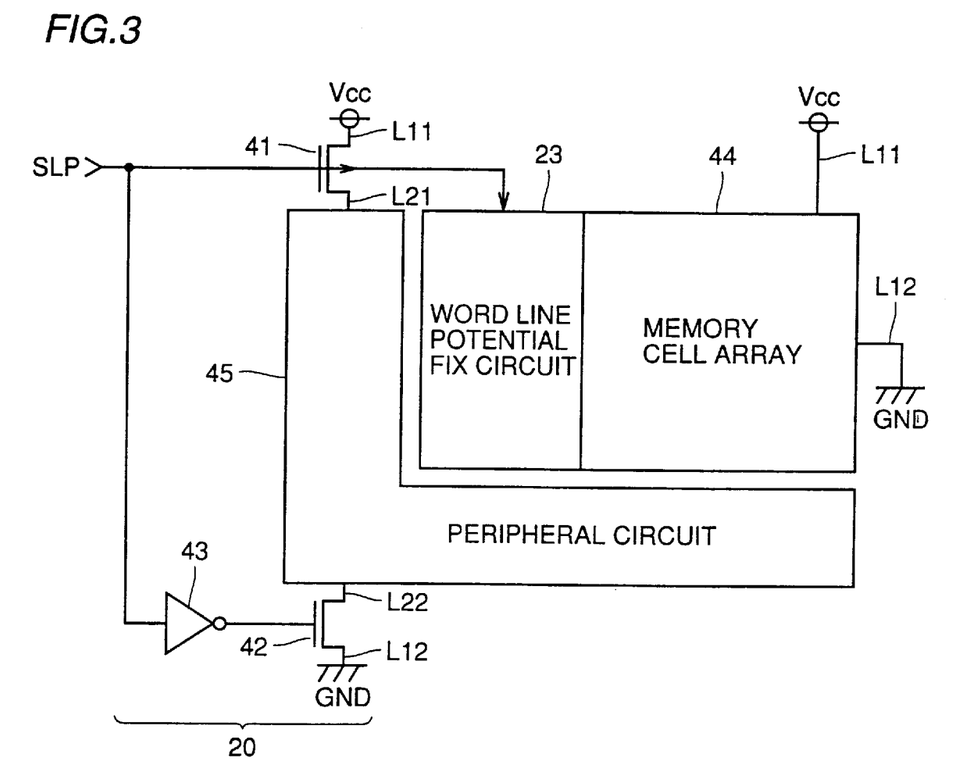
FIG. 3 is a circuit diagram showing a structure of a power supply control circuit shown in FIG. 1.

Specifically, power supply control circuit 20 includes a P channel MOS transistor 41, an N channel MOS transistor 42, and an inverter 43 as shown in FIG. 3. P channel MOS transistor 41 is connected between lines L11 and L21 of supply potential Vcc, and N channel MOS transistor 42 is connected between lines L12 and L22 of ground potential GND. Sleep signal SLP is directly input to the gate of P channel MOS transistor 41, and input to the gate of N channel MOS transistor 42 via inverter 43.

When sleep signal SLP attains "H" level of the activation level, MOS transistors 41 and 42 are rendered non-conductive so that supply of power supply potential Vcc and ground potential GND to lines L21 and L22 is stopped. When sleep signal SLP is set to "L" level of the inactivation level, MOS transistors 41 and 42 becomes conductive and supply potential Vcc and ground potential GND are supplied to lines L21 and L22.

Memory cell array 44, power supply control circuit 20 and word line potential fix circuit 23 directly receive supply potential Vcc and ground potential GND from lines L11 and L12. Here, memory cell array 44 refers to memory cells MC1–MC4, word lines WL1 and WL2, and bit lines BL1–/BL2 of FIG. 1. Peripheral circuit 45 corresponding those circuits except for memory cell array 44, power supply control circuit 20 and word line potential fix circuit 23 of FIG. 1 receives power supply potential Vcc and ground potential GND from lines L21 and L22.

Referring back to FIG. 1, address buffer 21 latches address signals A0–An externally supplied via address signal input terminal group 4, and selectively supplies them to row decoder 22 and column decoder 25.

Row decoder 22 raises any of the plurality of word lines WL1 and WL2 to "H" level of the selection level according to address signals A0–An supplied from address buffer 21.

Figure 4:
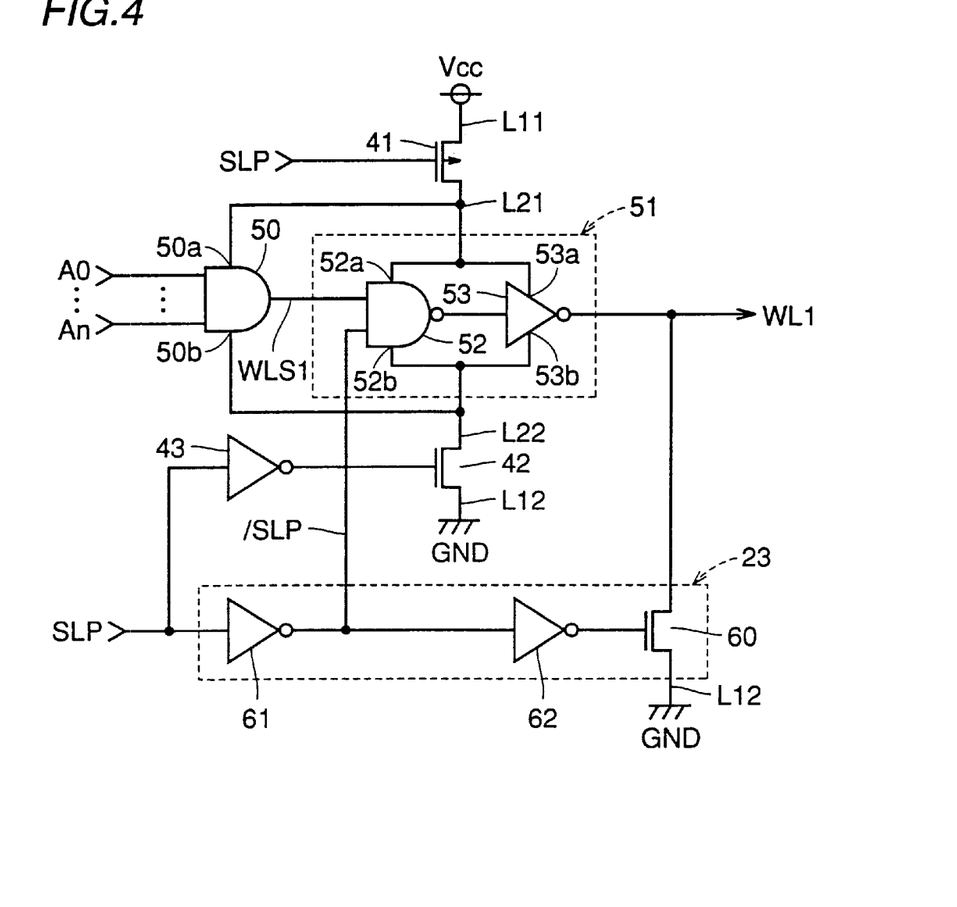
FIG. 4 is a circuit diagram showing structures of a row decoder and a word line potential fix circuit shown in FIG. 1.

Referring to FIG. 4, row decoder 22 includes a row decoder unit circuit (AND gate) 50 and a word line driver 51 that are provided correspondingly to each word line (WL1 in the figure). Row decoder unit circuit 50 outputs "H" level in response to input of address signals A0–An that are preliminary allocated to corresponding word line WL1.

Word line driver 51 includes an NAND gate 52 and an inverter 53. NAND gate 52 receives word line selection signal WLS1 which is an output signal from row decoder unit circuit 50, receives signal /SLP (an inverted signal of sleep signal SLP) generated by word line potential fix circuit 23, and its output is supplied to inverter 53. An output from inverter 53 is input to corresponding word line WL1.

During the active period in which signal /SLP is at "H" level, NAND gate 52 operates as an inverter for word line selection signal WLS1 so that word line selection signal WLS1 is directly transmitted to word line WL1. During the sleep period in which signal /SLP is at "L" level, an output from NAND gate 52 is fixed at "H" level regardless of word line selection signal WLS1, so that word line WL1 is set to "L" level.

A power supply node 50$a$ of row decoder unit circuit 50, a power supply node 52$a$ of NAND gate 52, and a power supply node 53$a$ of inverter 53 are all connected to line L21 of power supply potential Vcc, and to line L11 of power supply potential Vcc via P channel MOS transistor 41 of power supply control circuit 20. A ground node 50$b$ of row decoder unit circuit 50, a ground node 52$b$ of NAND gate 52, and a ground node 53$b$ of inverter 53 are all connected to line L22 of ground potential GND, and to line L12 of ground potential GND via N channel MOS transistor 42 of power supply control circuit 20.

Referring to FIG. 4, word line potential fix circuit 23 includes an N channel MOS transistor 60 provided correspondingly to each word line (WL1 in this figure), and inverters 61 and 62 commonly provided for N channel MOS transistors 60. N channel MOS transistor 60 is connected between corresponding word line WL1 and line L12 of ground potential GND. Sleep signal SLP is supplied to the gate of N channel MOS transistor 60 via inverters 61 and 62. Output signal /SLP from inverter 61 is input to one input node of NAND gate 52 of word line driver 51.

During the active period in which sleep signal SLP is at "L" level of the inactivation level, N channel MOS transistor 60 is non-conductive, so that selection of word lines WL1 and WL2 becomes possible. During the sleep period in which sleep signal SLP is at "H" level of the activation level, N channel MOS transistor 60 is conductive, so that word lines WL1 and WL2 are fixed at ground potential GND.

Figure 5:
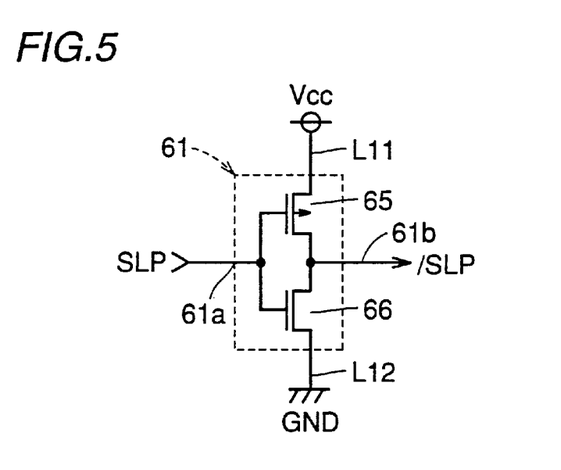
FIG. 5 is a circuit diagram showing a structure of an inverter 61 of the word line potential fix circuit shown in FIG. 4.
Figure 6A:
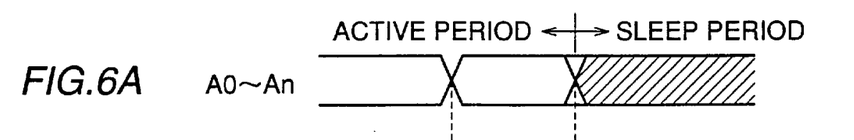
FIGS. 6A–6D are timing charts showing an operation of the SRAM shown in FIGS. 1–5.
Figure 6B:
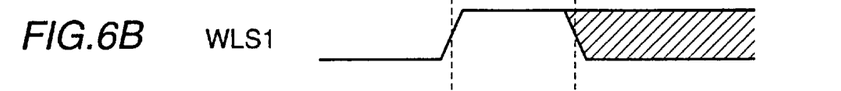
Figure 6C:
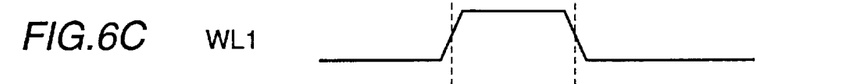
Figure 6D:
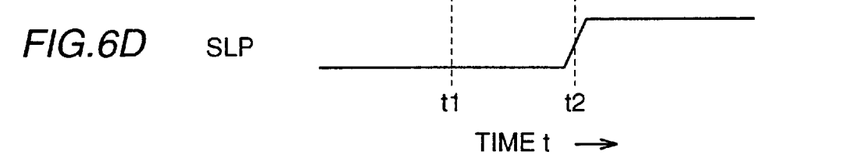

Referring to FIG. 5, inverter 61 includes a P channel MOS transistor 65 and an N channel MOS transistor 66 connected in series between line L11 of supply potential Vcc and line L12 of ground potential GND. MOS transistors 65 and 66 have their gates commonly connected to form an input node 61$a$ of inverter 61, and have their drains that form an output node 61$b$. Inverter 62 is configured similarly to inverter 61.

Referring back to FIG. 1, control circuit 24 selects a prescribed operation mode according to signals /CS, /WE and /OE externally supplied via control signal input terminals 5–7, and controls the entire SRAM. Column decoder 25 raises any of a plurality of column selection lines CSL1 and CSL2 to "H" level of the selection level according to address signals A0–An supplied from address buffer 21.

Write circuit 26 includes a data latch circuit and a write driver, sets one of data input/output lines IO and /IO to "H" level and the other to "L" level according to write data DI externally supplied via data input/output terminal 8, and writes data DI into a selected memory cell. Read circuit 27 includes a sense amplifier and a data latch circuit, compares the levels of data input/output lines IO and /IO, and outputs read data DO according to a result of the comparison externally via data input/output terminal 8.

FIGS. 6A–6D are timing charts showing an operation of the SRAM illustrated in FIGS. 1–5. The operation of the SRAM is hereinafter described according to the timing charts.

During the active period, sleep signal SLP is at "L" level of the inactivation level to render MOS transistors 41 and 42 of power supply control circuit 20 conductive, and power supply potential Vcc and ground potential GND are supplied to peripheral circuit 45 via lines L21 and L22. Further, N channel MOS transistors 60 of word line potential fix circuit 23 is rendered non-conductive, and NAND gate 52 of word line driver 51 operates as an inverter for word line selection signal (WLS1 in the figure) which is a signal output from row decoder unit circuit 50. Accordingly, at time t1, address signals A0–An allocated to word line WL1 are input and word line selection signal WLS1 rises to "H" level of the activation level, so that word line WL1 rises to "H" level of the selection level. As a result, memory cells MC1 and MC2 corresponding to word line WL1 are activated to allow data to be read/written.

In writing operation, word line WL1, for example, is raised to "H" level of the selection level by word line driver 51 and memory cells MC1 and MC2 are activated as described above. Column selection line CSL1, for example, is raised to "H" level of the selection level by column decoder 25 and column selection gate 17 is rendered conductive. Consequently, the activated memory cell MC1 is connected to write circuit 26 via bit line pair BL1 and /BL1 and data input/output line pair IO and /IO.

Write circuit 26 sets one of data input/output lines IO and /IO to "H" level and the other to "L" level according to write data DI externally supplied thereto, and writes data into memory cell MC1. When word line WL1 and column selection line CSL1 fall to "L" level, data is stored in memory cell MC1.

In reading operation, column selection line CSL1, for example, is raised to "H" level of the selection level by column decoder 25 to render column selection gate 17 conductive, so that bit line pair BL1 and /BL1 is connected to read circuit 27 via data input/output line pair IO and/IO. Precharge signal PC attains "H" level of the activation level to render bit line loads 11–14 conductive. Bit line equalize signal /BLEQ is set to "L" level of the activation level to render equalizers 15 and 16 conductive, and the potential on bit lines BL1 and /BL1 as well as BL2 and /BL2 is equalized to "H" level (Vcc-Vtn, Vtn is threshold voltage of bit line loads 11–12).

After precharge signal PC is set to "L" level of the inactivation level to render bit line loads 11–14 nonconductive and bit line equalize signal /BLEQ is set to "H" level of the inactivation level to render equalizers 15 and 16 non-conductive, word line WL1, for example, is raised to "H" level of the selection level by word line driver 51, so that memory cells MC1 and MC2 are activated. Accordingly, current flows from one of bit lines BL1 and /BL1 to memory cell MC1 according to data stored by memory cell MC1, and the potential on one of data input/output lines IO and /IO decreases accordingly. Read circuit 27 compares the potential on data input/output lines IO and /IO and outputs read data DO according to a result of the comparison externally via data input/output terminal 8.

When the sleep period starts at time t2, sleep signal SLP attains "H" level of the activation level to render MOS transistors 41 and 42 of power supply control circuit 20 non-conductive, and supply of power supply potential Vcc and ground potential GND to peripheral circuit 45 is stopped. Therefore, current consumed by peripheral circuit 45 decreases approximately to off-leakage current of MOS transistors 41 and 42 of power supply control circuit 20. In this case, power supply potential Vcc and ground potential GND may or may not be supplied to a substrate of a transistor constituting peripheral circuit 45 depending on a fabrication process and layout of a semiconductor circuit. When power supply potential Vcc and ground potential GND are supplied to the substrate of the transistor, off-leakage current through the peripheral circuit 45 is smaller because of body effect of the transistor, and increase of consumption current through the substrate is extremely small.

In addition, one input node of NAND gate 52 of word line driver 51 is set to "L" level so that word lines WL1 and WL2 are set to "L" level. If MOS transistors 41 and 42 of power supply control circuit 20 are rendered non-conductive, supply nodes 50a, 52a and 53a as well as ground nodes 50b, 52b and 53b of row decoder unit circuit 50, NAND gate 52 and inverter 53 are set in a floating state and outputs from row decoder unit circuit 50, NAND gate 52 and inverter 53 become unstable. However, N channel MOS transistor 60 of word line potential fix circuit 23 becomes conductive to firmly fix word lines WL1 and WL2 at "L" level. Consequently, the potential on word lines WL1 and WL2 never become unstable as in the conventional memory device, access transistors 35 and 36 of memory cells MC1–MC4 are never rendered conductive, and data stored in memory cells MC1–MC4 are not destroyed.

During the sleep period, power supply potential Vcc is still supplied to word line potential fix circuit 23 and word line potential fix circuit 23 consumes the current. However, since word line potential fix circuit 23 is not involved in the data reading/writing operation, word line potential fix circuit 23 is not required to operate at a high speed. If threshold voltage of MOS transistors 60, 65 and 66 constituting word line potential fix circuit 23 is set higher than threshold voltage of an MOS transistor constituting peripheral circuit 45, off-leakage current can be decreased to reduce the current consumed by word line potential fix circuit 23 during the sleep period.

It is not required to increase threshold voltage of all of the MOS transistors 60, 65 and 66 in word line potential fix circuit 23. Only the threshold voltage of MOS transistors affecting consumption power during the sleep period, that is, the threshold voltage of P channel MOS transistor 65 of inverter 61, N channel MOS transistor 66 of inverter 62, and N channel MOS transistor 60 may be increased to be higher than that of the MOS transistor of peripheral circuit 45.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device having an active mode for reading/writing and holding data, and a sleep mode for holding data and prohibiting data from being read and written, comprising:
    a memory cell array including a plurality of memory cells arranged in rows and columns, word lines provided correspondingly to respective rows, and bit line pairs provided correspondingly to respective columns;
    a read/write circuit selecting any of the memory cells in said memory cell array according to an address signal for reading/writing data from/into the memory cell;
    power supply control means for supplying power supply voltage to said read/write circuit in said active mode, and cutting off supply of the power supply voltage to said read/write circuit in said sleep mode; and
    switch means provided correspondingly to each word line, connected between the corresponding word line and a line of reference potential, and rendered conductive in said sleep mode for fixing the corresponding word line in a non-selected state.

2. The static semiconductor memory device according to claim 1, wherein
    said read/write circuit includes
        signal generation means for selecting any of a plurality of said word lines and outputting a word line selection signal to set the selected word line in a selected state according to said address signal, and
        gate means receiving the word line selection signal output from said signal generation means for passing said word line selection signal to a corresponding word line in said active mode and for inhibiting said word line selection signal from passing in said sleep mode.

3. The static semiconductor memory device according to claim 1, wherein
    said switch means includes a transistor having threshold voltage higher than that of a transistor included in said read/write circuit.

4. The static semiconductor memory device according to claim 1, wherein
    said read/write circuit includes a plurality of transistors formed on a semiconductor substrate, and
    said power supply voltage is applied to said semiconductor substrate during both periods of said active mode and said sleep mode.

5. A static semiconductor memory device having an active mode for reading/writing and holding data, and a sleep mode for holding data and prohibiting data from being read and written, comprising:
    a memory cell array including a plurality of memory cells arranged in rows and columns, word lines provided correspondingly to respective rows, and bit line pairs provided correspondingly to respective columns;
    a read/write circuit selecting any of the memory cells in said memory cell array according to an address signal for reading/writing data from/into the memory cell;
    a first transistor connected to said read/write circuit, for supplying power supply voltage to said read/write circuit in said active mode, and cutting off supply of the power supply voltage to said read/write circuit in said sleep mode; and
    second transistors provided correspondingly to respective word lines, each second transistor being connected between the corresponding word line and a line of reference potential, and being rendered conductive in said sleep mode for fixing the corresponding word line in a non-selected state.

6. The static semiconductor memory device according to claim 5, wherein
    said read/write circuit includes
        a row decoder for decoding the address signal to output word line selection signals for selecting one of said word lines, and
        gates for receiving the word line selection signals from said row decoder, correspondingly, each gate being configured for passing a corresponding word line selection signal to a corresponding word line in said active mode, and for inhibiting the corresponding word line selection signal from passing in said sleep mode.

7. The static semiconductor memory device according to claim 5, wherein said second transistors have threshold voltage higher than that of a transistor included in said read/write circuit.

8. The static semiconductor memory device according to claim 5, wherein said read/write circuit includes a plurality of third transistors formed on a semiconductor substrate, and said power supply voltage is applied to said semiconductor substrate during both periods of said active mode and said sleep mode.

\* \* \* \* \*